US011855640B2

(12) United States Patent
Daruwalla et al.

(10) Patent No.: US 11,855,640 B2
(45) Date of Patent: Dec. 26, 2023

(54) PROGRAMMABLE CLAMPING DEVICES AND METHODS

(71) Applicant: pSemi Corporation, San Diego, CA (US)

(72) Inventors: Parvez Daruwalla, San Diego, CA (US); Khushali Shah, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/380,001

(22) Filed: Jul. 19, 2021

(65) Prior Publication Data

US 2023/0015675 A1  Jan. 19, 2023

(51) Int. Cl.
*H03K 5/08* (2006.01)
*H03F 3/19* (2006.01)
*H03G 11/02* (2006.01)

(52) U.S. Cl.
CPC .............. *H03K 5/08* (2013.01); *H03F 3/19* (2013.01); *H03G 11/02* (2013.01); *H03F 2200/294* (2013.01); *H03F 2200/451* (2013.01)

(58) Field of Classification Search
CPC .......... H03K 5/08; H03K 5/5082; H03F 3/19; H03F 2200/258; H03F 2200/294; H03F 2200/441; H03F 2200/444; H03F 2200/451; H03F 2203/45158; H03G 11/00; H03G 11/02; H03G 11/025; H03G 11/04

See application file for complete search history.

(56) References Cited

U.S. PATENT DOCUMENTS

| 8,928,388 | B2 | 1/2015 | Lu et al. | |
|---|---|---|---|---|
| 9,886,658 | B1 * | 2/2018 | Stanford | G06K 19/07786 |
| 10,572,789 | B1 * | 2/2020 | Stanford | G06K 19/0709 |

* cited by examiner

*Primary Examiner* — Long Nguyen
(74) *Attorney, Agent, or Firm* — Steinfl + Bruno LLP

(57) ABSTRACT

Programmable clamping methods and devices providing adjustable clamping powers to accommodate different applications and requirements are disclosed. The described devices can use switchable clamping circuits having different structures, body-controlled clamping circuits, or clamping circuits adjusting their input power levels using programmable resistive ladders. Examples of how the disclosed devices can be combined to improve design flexibility are also provided.

20 Claims, 16 Drawing Sheets

300B

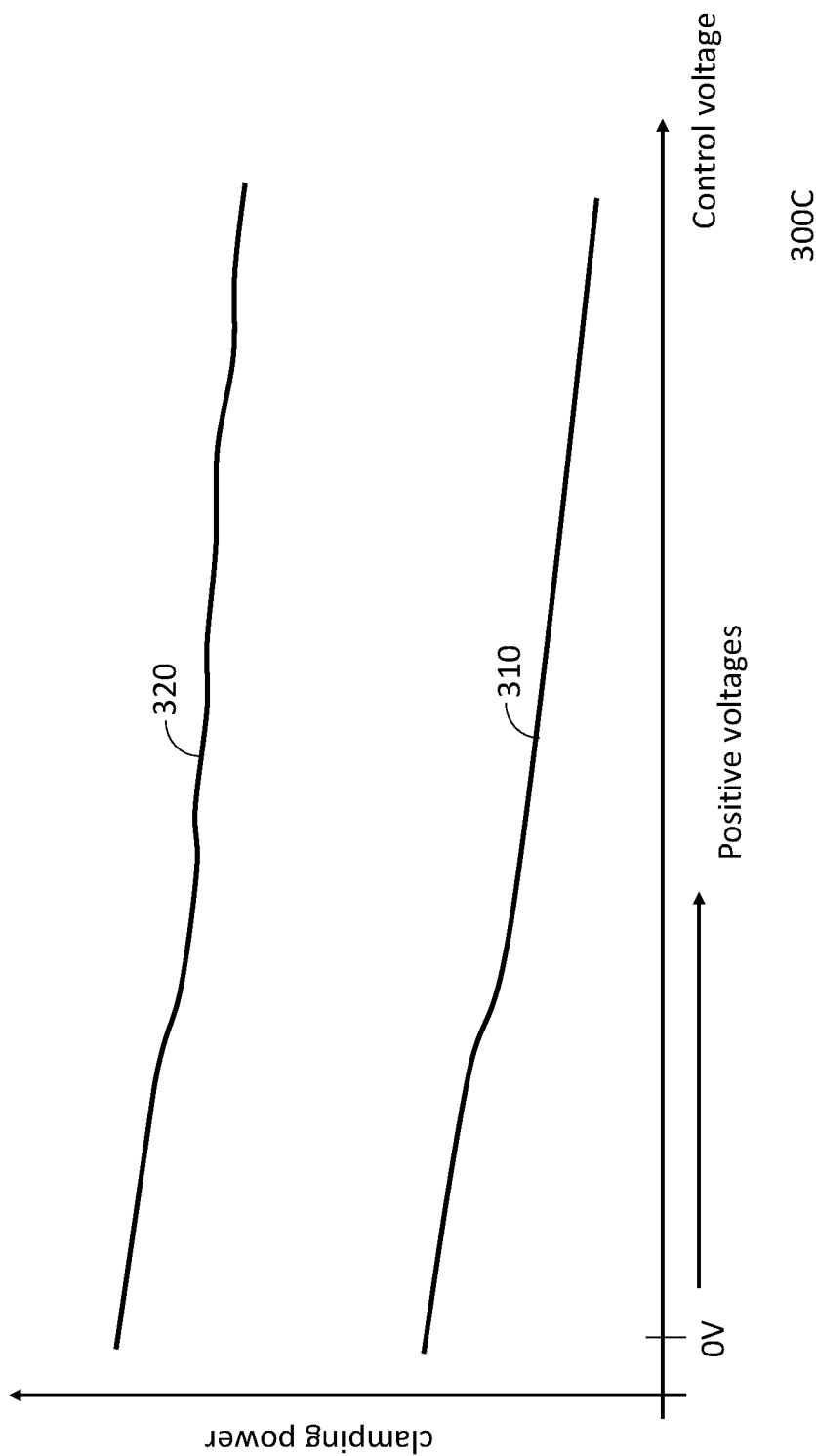

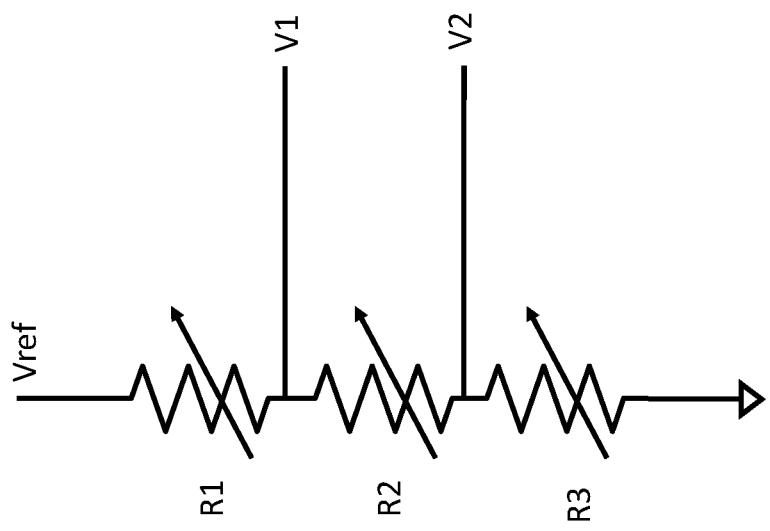

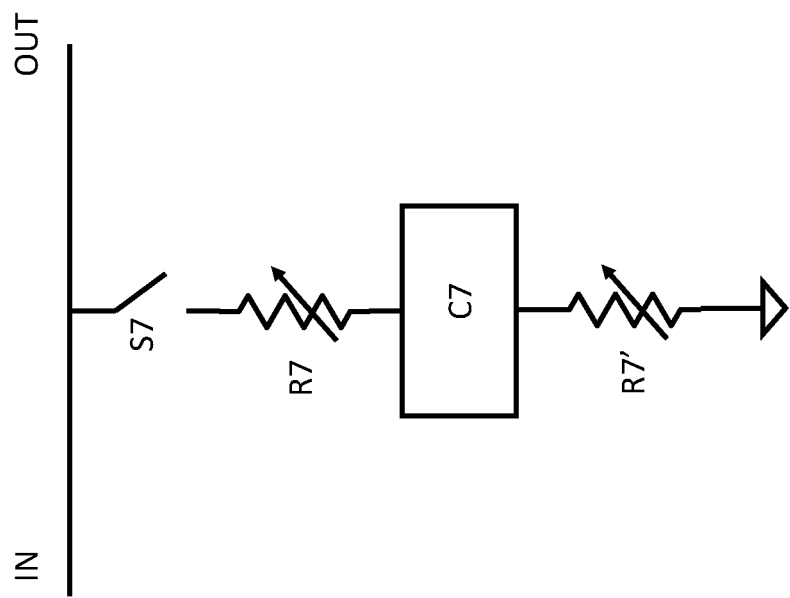

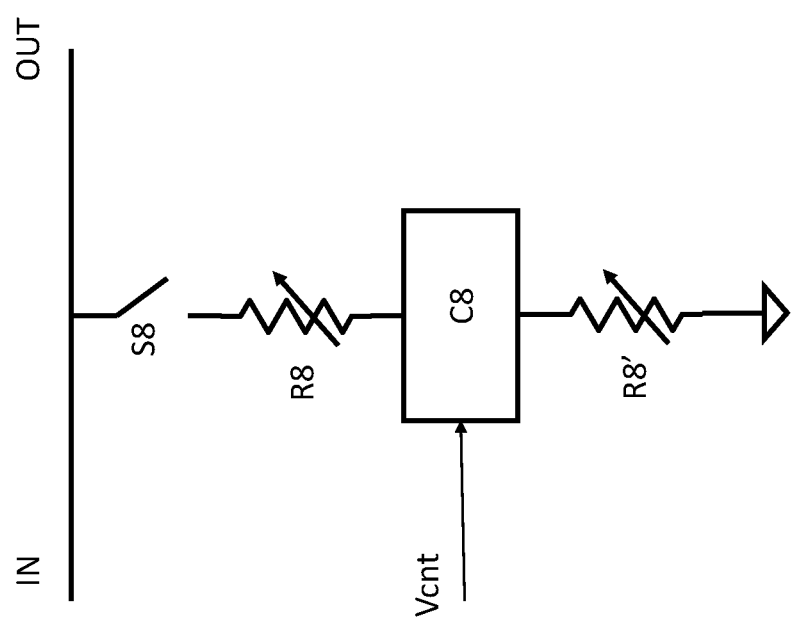

PROGRAMMABLE CLAMPING DEVICES AND METHODS

BACKGROUND

(1) Technical Field

The present disclosure is related to clamping methods and devices used in radio frequency (RF) systems, more in particular to programmable clamping methods and devices providing adjustable clamping powers to accommodate different applications and requirements.

(2) Background

Throughout the disclosure the term "clamping power" is used to refer to the output power level of a clamping circuit being in operative conditions. Stated differently, the term "clamping power" refers to the level of the power at which the signal at the output of a clamping circuit is clamped.

The receiver front-end of RF transceivers generally includes one or more low noise amplifiers (LNAs). One of the requirements of the LNAs is a maximum output power in the presence of higher input powers. Clamping circuits are often implemented as part of the receiver front-end to meet the maximum output power requirements. This is performed by clamping the power at the output of the LNAs to protect the downstream circuitry from a possible power surge at the input.

Existing clamping circuits, e.g. diodes or diode connected NMOS anti-parallel pairs, clamps at the same power level which depends on device type, the device threshold voltage (Vth) the frequency of operation, parasitics, the input/output impedance and the power seen by the clamping circuit. FIG. 1A shows a prior art clamping circuit (C1) used to clamp the possible excess power at input (IN) to meet the maximum output power requirements at output (OUT). Clamping circuit (C1) can be switched in and out depending on the state of switch (SW). As an example, FIG. 1B shows, for a certain frequency, the output power of clamping circuit (C1) for two different input powers and for the cases where the clamping is used or not used. For a first and a second input power, and when the clamp is not in use, the output powers at output (OUT) are (P1, P2) respectively. On the other hand, when the clamping circuit (C1) is switched in, the clamping output powers at output (OUT) are (P1', P2') respectively. As mentioned before, clamping powers (P1', P2') are fixed for the given frequency of operation and they depend on the threshold voltage (Vth) of the device used in the design of the clamping circuit (C1).

For extremely wideband LNAs, the different bands are clamped to a different power level due to different input/output match, parasitic, etc. This means that, for certain designs, adjusting the clamping circuit output power will be needed in order to meet specifications. In other words, an unnecessary over-design is often needed to accommodate all the frequencies across the operation frequency band. This has a negative impact on performance parameters such as the Input Third Order Intercept Point (IIP3) and/or the 1 dB Compression Point (P1 dB).

In order to further clarify the point made above, reference is made to FIG. 2 illustrating the clamping circuit design challenges mentioned above. Curve (201) shows the variation of a prior art clamping circuit as a function of frequency of operation. Curve (202) represents the output power requirement which is typically a horizontal line (i.e. constant maximum allowed output power) across the operational frequency band. An ideal design where the clamping power is less than the output power requirement and is flat over the frequency band is shown by curve (203). It can be noticed that an over-design, shown by arrow (204) at a lower frequency (e.g. f1) is required to meet the specification. As a result, the front-end receiver performance parameters such as IIP3 and P1 dB will be degraded.

In view of the above, there is a need for clamping circuits to meet (or at least come close to) the maximum output power requirements without compromising the overall RF performance by maintaining. performance parameters such as IIP3/P1 dB within the specifications. Such solutions should be across a large amount of (possibly all) operational frequency bands.

SUMMARY

The disclosed methods and devices address the above-mentioned problems and provide solutions to the described design challenges. The disclosed solutions provide the flexibility of reusing designs for multiple applications with different specifications and requirements.

According to a first aspect of the present disclosure, a radio-frequency (RF) circuit configured to feed an RF signal with an input power level from an input to an output through a terminal is provided, the RF circuit comprising a clamping circuit switchably connectable to the terminal, the clamping circuit being configured, in a switched-in state, to clamp the input power level of the RF signal at the terminal to an output power level lower than the input power level, the clamping circuit comprising one or more control inputs to receive control signals to adjust clamping power of the clamping circuit and select the output power level.

According to a second aspect of the present disclosure, a radio-frequency (RF) circuit configured to feed an RF signal with an input power level from an input to an output through a terminal is provided, the RF circuit comprising a plurality of clamping circuits, each clamping circuit of the plurality of clamping circuits being switchably connectable to the terminal a single one at a time, one or more clamping circuits having clamping powers different from a clamping power of other clamping circuits of the plurality of clamping circuits.

According to a third aspect of the present disclosure, a radio-frequency (RF) circuit configured to feed an RF signal with an input power level from an input to an output through a terminal is provided, the RF circuit comprising a plurality of clamping circuits, the plurality of clamping circuits being switchably connectable to the terminal two or more at a time.

According to a fourth aspect of the present disclosure, a radio-frequency (RF) circuit configured to feed an RF signal with an input power level from an input to an output through a terminal is provided, the RF circuit comprising a resistive arrangement coupled in series to a clamping circuit, the resistive arrangement comprising one or more variable resistors, the resistive arrangement and the clamping circuit being switchably connectable to the terminal at one end, and the resistive arrangement and the clamping circuit being coupled to ground or a reference voltage at another end.

According to a fifth aspect of the present disclosure, a method of adjusting a clamping power of a clamping circuit comprising a first diode-connected N-type field effect transistor and a second diode-connected N-type field effect transistor arranged in an antiparallel configuration, the method comprising controllably applying a first control voltage to a body terminal of the first diode-connected N-type field effect transistor and a second control voltage to a body terminal of the second diode-connected N-type field effect transistor, respectively, thereby adjusting the clamping power of the clamping circuit.

The details of one or more embodiments of the present disclosure are set forth in the accompanying drawings and the description below. Other features, objects, and advantages of the invention will be apparent from the description and drawings, and from the claims.

DESCRIPTION OF THE DRAWINGS

FIG. 3C shows an exemplary graph illustrating the variations of the clamping power as a function of the control voltage.

FIG. 3D shows a resistive voltage divider representing an exemplary implementation of a control block according to an embodiment of the present disclosure.

FIG. 7A shows an exemplary clamping block according to an embodiment of the present disclosure.

FIG. 8 shows an exemplary clamping block according to an embodiment of the present disclosure.

Like reference numbers and designations in the various drawings indicate like elements.

DETAILED DESCRIPTION

Clamping circuits or clamps are arrangements that reduce the power level of a signal to an acceptable value (i.e. less than a set threshold) in order to prevent overvoltage conditions.

Figure 1B:
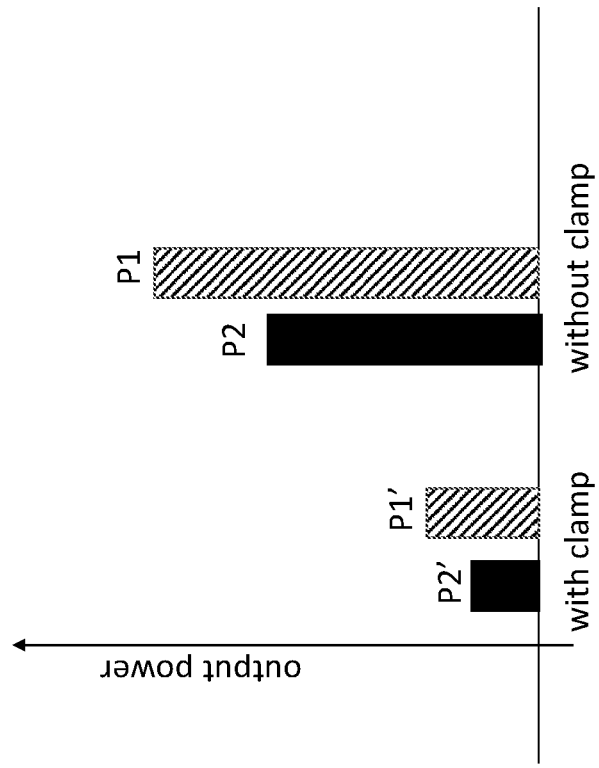
FIG. 1B shows the clamping power of a prior art clamping circuit when such clamping circuit is in use or not in use.
Figure 1A:
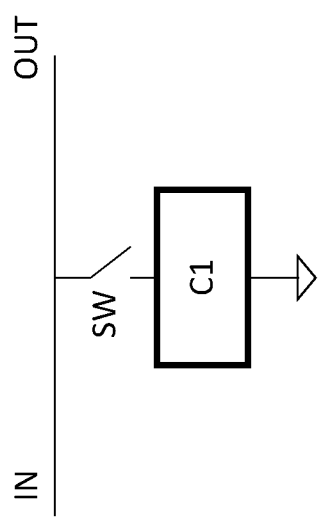
FIG. 1A shows a prior art clamping circuit.
Figure 2:
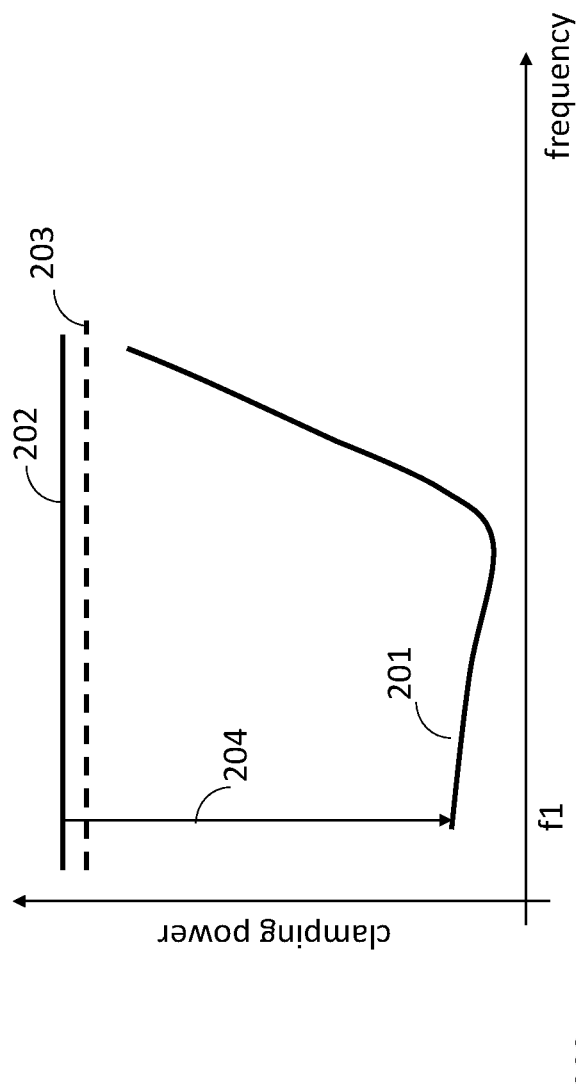
FIG. 2 shows the clamping power of a prior art clamping circuit vs. frequency of operation.
Figure 3A:
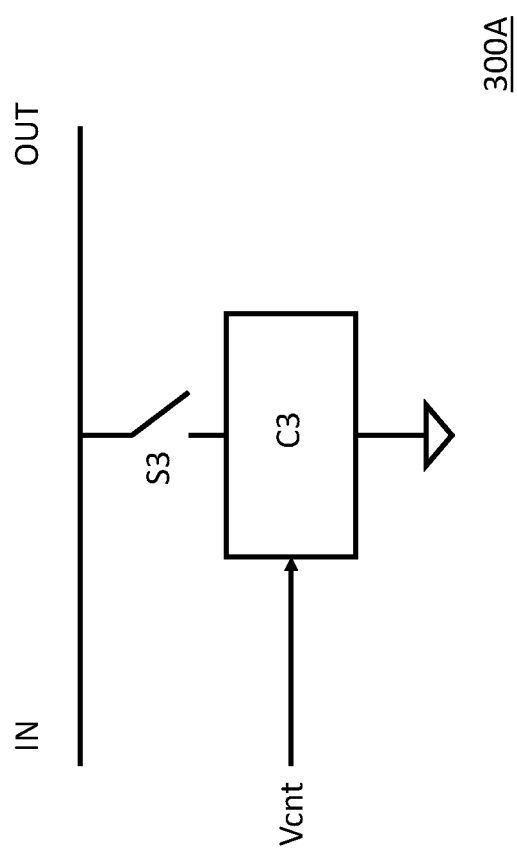
FIG. 3A shows an exemplary clamping block according to an embodiment of the present disclosure.

FIG. 3A shows an exemplary clamping block (300A) according to an embodiment of the present disclosure. Clamping block (300A) comprises clamping circuit (C3) used to clamp the possible excess power at input (IN) to meet the maximum output power requirements at output (OUT). Clamping circuit (C3) can be switched in or out depending on the state of switch (S3). In this embodiment, clamping circuit (C3) is configured to receive control signal (Vcnt) that is used to adjust the clamping power of clamping circuit (C3).

Figure 3B:
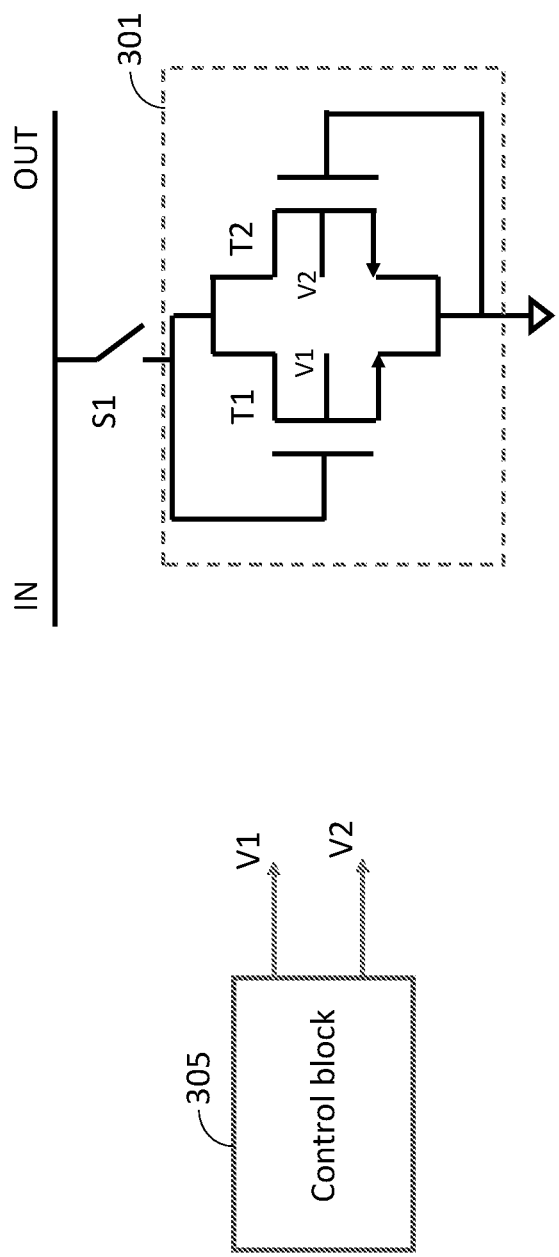
FIG. 3B shows an exemplary implementation of a clamping circuit according to an embodiment of the present disclosure.

FIG. 3B shows an exemplary clamping block (300B) including clamping circuit (301) which represents an exemplary implementation of clamping circuit (C3) of FIG. 3A. Clamping circuit (301) comprises transistors (T1, T2) arranged in antiparallel diode connected configuration. Body terminals of transistors (T1, T2) are configured to receive control voltages (V1, V2) respectively. As such, the threshold voltages of such transistors are adjusted based on the applied control voltages (V1, V2), thereby providing different clamping powers at output (OUT). This will provide more flexibility to the general design wherein by varying the control voltages and thus modifying the threshold voltage, the clamping power can be controlled depending on the requirements and applications.

FIG. 3C shows an exemplary graph (300C) illustrating the variations of the clamping power of clamping circuit (301) of FIG. 3B as a function of the control voltage. In this exemplary graph, the same control voltage is applied to the body terminals of both transistors (T1, T2), i.e. voltages V1 and V2 are equal, and transistors (T1, T2) are NMOS pairs. Curve (310) corresponds to a first input power (e.g. 15 dBm) and curve (320) corresponds to a second input power (e.g. 20 dBm) being higher than the first input power. As can be noticed, starting from 0V and increasing the control voltage applied to the body terminals of the NMOS pair to up to, for example, around 1.5 V, result in a variation of the clamping power with a decreasing trend.

With reference to, e.g., FIG. 3B, control voltages (V1, V2) may be provided externally by control block (305). FIG. 3D shows a resistive divider (300D) representing an exemplary implementation of control block (305) of FIG. 3B. Resistive divider (300D) comprises three variable resistors (R1, R2, R3) wherein control voltages (V1, V2) are provided at different nodes within resistive divider (300D). However, if desired, control voltages (V1, V2) may be equal, i.e. coming from the same node in resistive divider (300D). The person skilled in the art will appreciate that variable resistors (R1, R2, R3) do not need to be of larger size as they are not in the RF path and as such, the addition of such resistors will have a minor impact on the size of the overall design. Resistive divider (300D) is an exemplary illustration of how control voltages (V1, V2) can be generated. Other embodiments using different mechanisms to generate such voltages may also be envisaged. According to the teachings of the present disclosure, the selection of control voltages (V1, V2) may be decoder based or fuse based. In some embodiments, such selection may be performed by the user.

With further reference to FIG. 3B, transistors (T1, T2) may be NMOS or PMOS with four terminals. It is also appreciated that, compared to a conventional clamping circuit implementation, the addition of control voltages for body terminal control will not add any additional parasitic capacitance in the RF path. In accordance with the teachings of the present disclosure, control voltages (V1, V2) may be selected based on transistors (T1, T2) reliability requirements (e.g. 1.3V).

Figure 4:
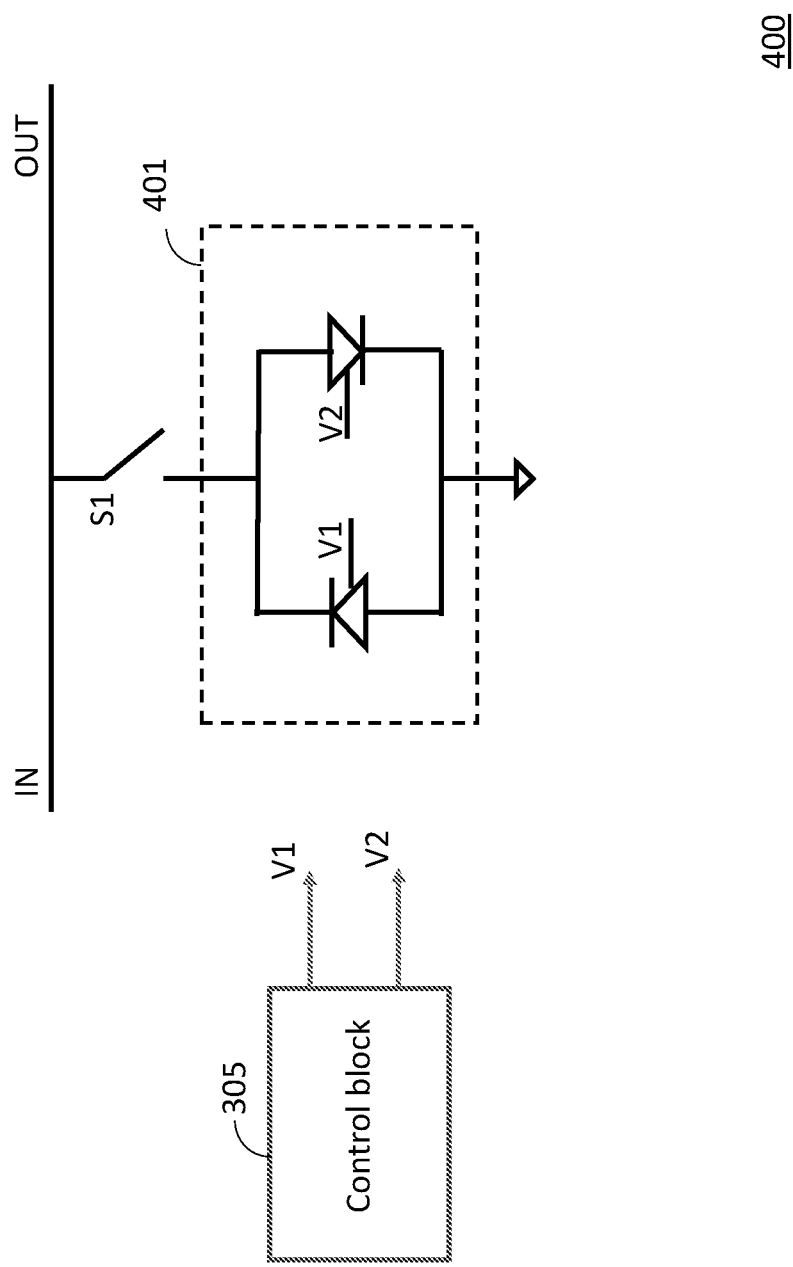
FIG. 4 shows an exemplary implementation of the clamping block of FIG. 3A.

FIG. 4 shows an exemplary clamping block (400) including clamping circuit (401) which represents an exemplary implementation of clamping circuit (C3) of FIG. 3A. Clamping circuit (401) comprises two three-terminal diodes (D1, D2) with body biasing, the diodes being arranged in antiparallel configuration. Body terminals of diodes (D1, D2) are configured to receive control voltages (V1, V2) respectively. The principle of operation of clamping circuit (401) is similar to what was described with regards clamping circuit (300B) of FIG. 3B except that the control voltages are applied to the body terminals of diodes (D1, D2). As such, what was disclosed with regards to FIG. 3B equally applies to the embodiment of FIG. 4.

Figure 5A:
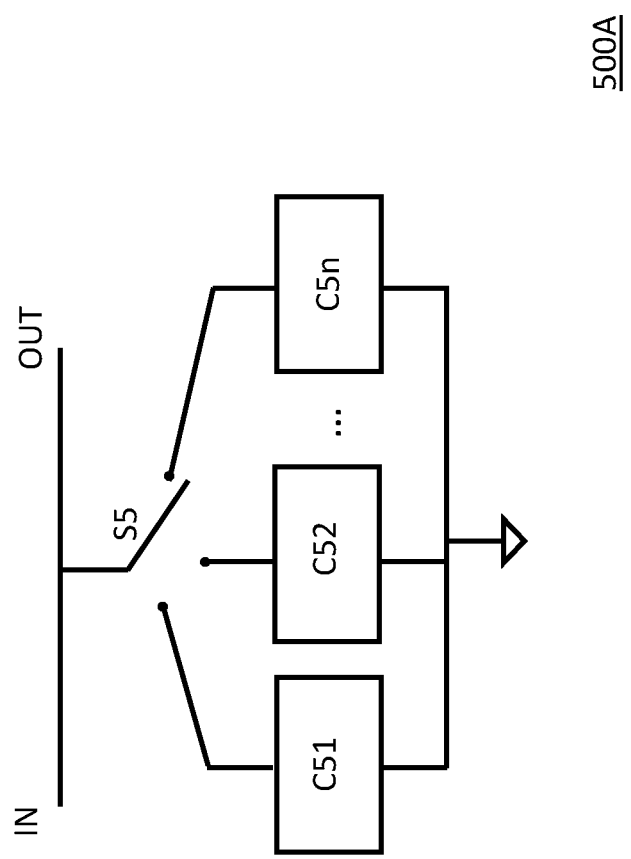
FIG. 5A shows an exemplary clamping block according to an embodiment of the present disclosure.

FIG. 5A shows an exemplary clamping block (500A) according to an embodiment of the present disclosure. Clamping block (500A) comprises a selectable plurality of clamping circuits (C51, . . . , C5n) used to clamp the possible excess power at input (IN) to meet the maximum output power requirements at output (OUT). Each of the clamping circuits (C51, . . . , C5n) can be switched in or out depending on the state of switch (S5). According to the teachings of the present disclosure, during operative conditions, clamping circuits (C51, . . . , C5n) may switch in one at a time, i.e. if one of such clamping circuits is switched in, all other switches are switched out. In an embodiment, switch (S5) is a single-pole N-throw (SPNT) switch with an isolation (ISO) mode.

With further reference to FIG. 5A, each of the clamping circuits (C51, . . . , C5n) may have a different structure and/or operative behavior resulting in a variety of clamping powers. This will provide more flexibility to the design by enabling various applications requiring different maximum allowed output power. By way of example, each of the clamping circuits (C51, . . . , C5n) may include different device types, e.g. thin oxide, thick oxide, N or P devices. In other words, devices with different threshold voltages (Vth) may be implemented to offer more flexibility in terms of the provided clamping power. The person skilled in the art will also appreciate that each of the clamping circuits (C51, . . . , C5n) may be implemented based on a different topology, e.g. antiparallel diodes or diode-connected FETs. According to the teachings of the present disclosure, the number clamping circuits, i.e. n, can be any arbitrary number greater than or equal to two. The number of clamping circuits implemented in a certain design may be driven, for example, by the required area and related constraints imposed by the specifications.

Figure 5B:
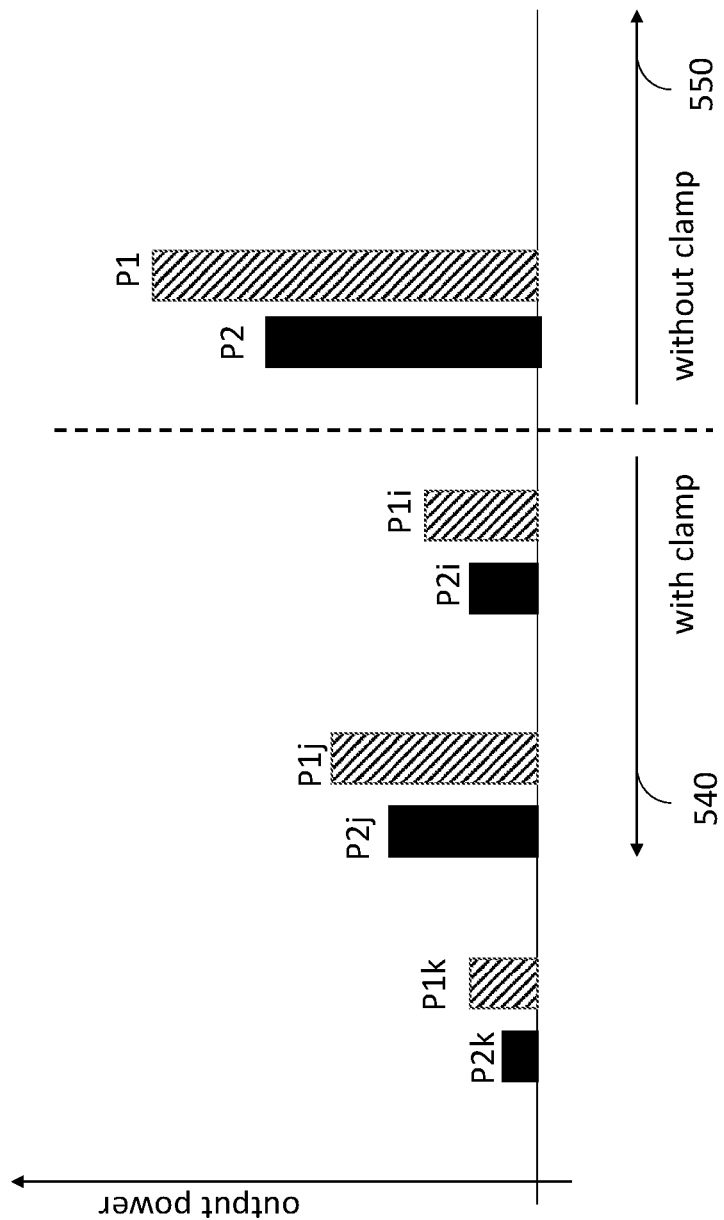
FIG. 5B shows an exemplary graph illustrating the clamping power according to an embodiment of the present disclosure.

FIG. 5B shows an exemplary graph illustrating the output power of clamping block (500A) of FIG. 5A for two different input powers and for the cases where clamping is used, as indicated by arrow (540), and not used, as indicated by arrow (550). For a first and a second input power, and when the clamp is not in use, the output powers at output (OUT) are (P1, P2) respectively. For the same first and second input power:

when clamping circuit (C5i) is switched in, the clamping output power at output (OUT) are (P1i, P2i), respectively, when clamping circuit (C5j) is switched in the clamping output power at output (OUT) are (P1j, P2j), respectively, and when clamping circuit (C5k) is switched in the clamping output power at output (OUT) are (P1k, P2k), respectively, where clamping circuits (C5i, C5j, C5k) are three of clamping circuits (C51, . . . , C5n) that are switched in one at a time, and that have different designs/structures and/or use different devices. Exemplary values for the clamping output power when clamping circuits are used include but are not limited to a range of 1 to 15 dBm.

As mentioned previously, the use of switchable clamping circuits provides the possibility of different clamping powers, thus accommodating various applications with different maximum output power requirements. The clamping output power can be increased and decreased depending on the devices implemented in correspondence with the output power requirements. With reference to clamping block (500A) of FIG. 5A, all such advantages will have to be balanced by the person skilled in the art with the intrinsic addition of parasitics due to the presence of multiple circuits and the necessity to size the switch (S5) for power handling purposes.

Figure 6A:
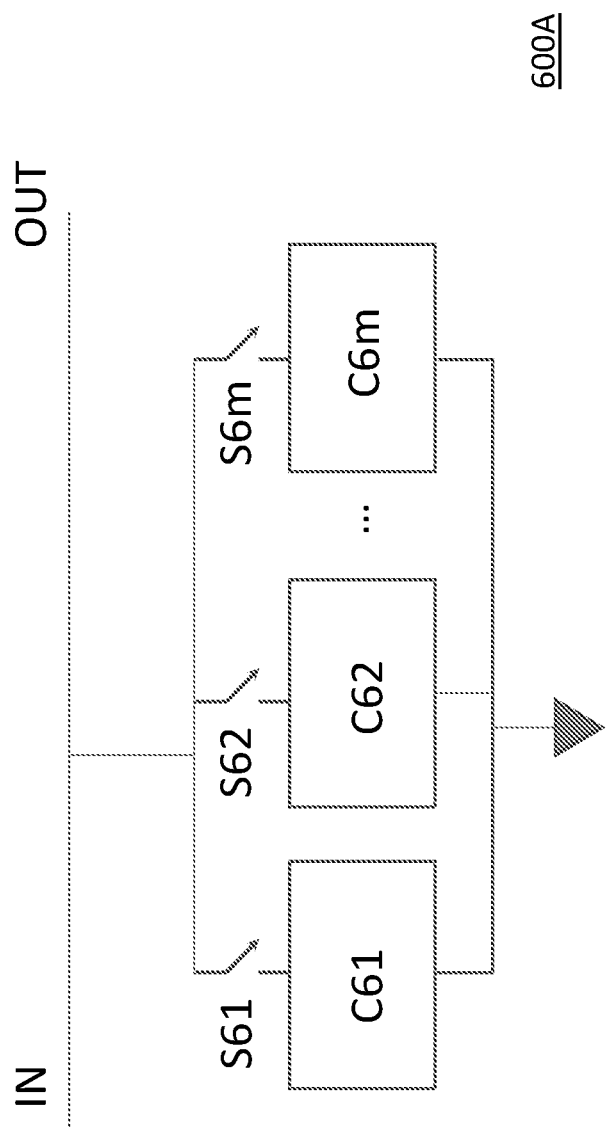
FIG. 6A shows an exemplary clamping block according to an embodiment of the present disclosure.

FIG. 6A shows an exemplary clamping block (600A) according to an embodiment of the present disclosure. Clamping block (600A) comprises a plurality of clamping circuits (C61, . . . , C6m) used to clamp the possible excess power at input (IN) to meet the maximum output power requirements at output (OUT). In a preferred embodiment, clamping circuits (C61, . . . , C6m) are all similar using the same device types and structure. Moreover, in the same preferred embodiment two or more of clamping circuits (C61, . . . , C6m) can be switched in depending on the state of switches (S61, . . . , S6m). As such, by placing two or more switching circuits in parallel, the 'effective' threshold voltage of the resulting clamping circuit may be varied to achieve different clamping powers. For example, if the clamping circuits (C61, . . . , C6m) are implemented using NFET devices, by switching in two or more of such clamping circuits at the same time, the effective width of the overall device is increased, resulting in a change in the effective threshold voltage and the resulting clamping power.

Figure 6B:
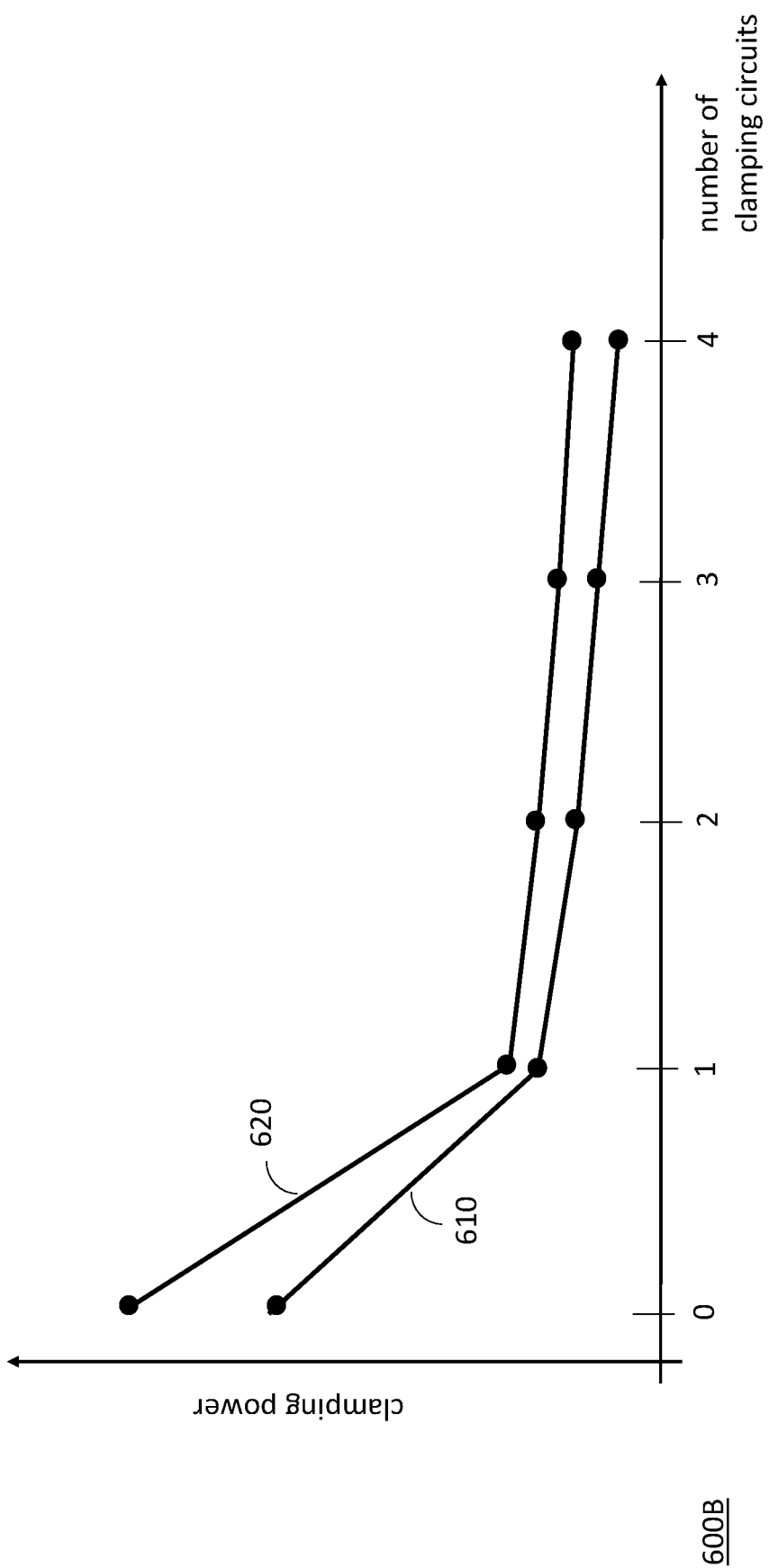
FIG. 6B shows an exemplary graph illustrating clamping power vs. the number of clamping circuits according to an embodiment of the present disclosure.

To further clarify the above-disclosed teachings, reference is made to FIG. 6B showing graph (600B). Curves (610, 620) represent the clamping power vs. the number of clamping circuits for a first and a second input power, respectively, the second input power being greater than the first input power. As an example, the first and the second input power can be 15 dBm and 20 dBm respectively. As can be noticed, the clamping output power decreases when increasing the number of clamping circuits placed in parallel. According to an embodiment of the present disclosure, switch (S6) of FIG. 6A can comprise k single-pole single-throw (SPST) switches with isolation mode (ISO). Similar to what was described with regards to the embodiment of FIG. 5A, the number of clamping circuits, i.e. m, can be any arbitrary number greater than or equal to two. The number of clamping circuits implemented in a certain design may be driven, for example, by the required area and related constraints imposed by the specifications.

With further reference to clamping block (600A) of FIG. 6A, also in this case the addition of multiple circuits may introduce more parasitics, which factor will have to be taken into consideration by the person skilled in the art during circuital design, together with the requirement that switch (S6) may have to be sized for power handling purposes. The clamping output power can be increased and decreased depending on the number of clamping circuits switched in based on the output power requirements.

FIG. 7A shows an exemplary clamping block (700A) according to an embodiment of the present disclosure. Clamping block (700A) comprises clamping circuit (C7) used to clamp the possible excess power at input (IN) to meet the maximum output power requirements at output (OUT). Also shown in FIG. 7A, are two variable resistors (R7, R7') disposed in series with clamping circuit (C7). A combination of resistors (R7, R7') and clamping circuit (C7) can be switched in or out depending on the state of switch (S7). In an embodiment, switch (S7) is an SPST switch. In accordance with the teachings of the present disclosure, by varying the variable resistors (R7, R7') the input power to clamping circuit (C7) is changed thus varying the clamp output power at output (OUT). The higher the resistance of the resistors, the lower is the power level seen by clamping circuit (C7) and the higher the clamp output power will be.

Figure 7B:
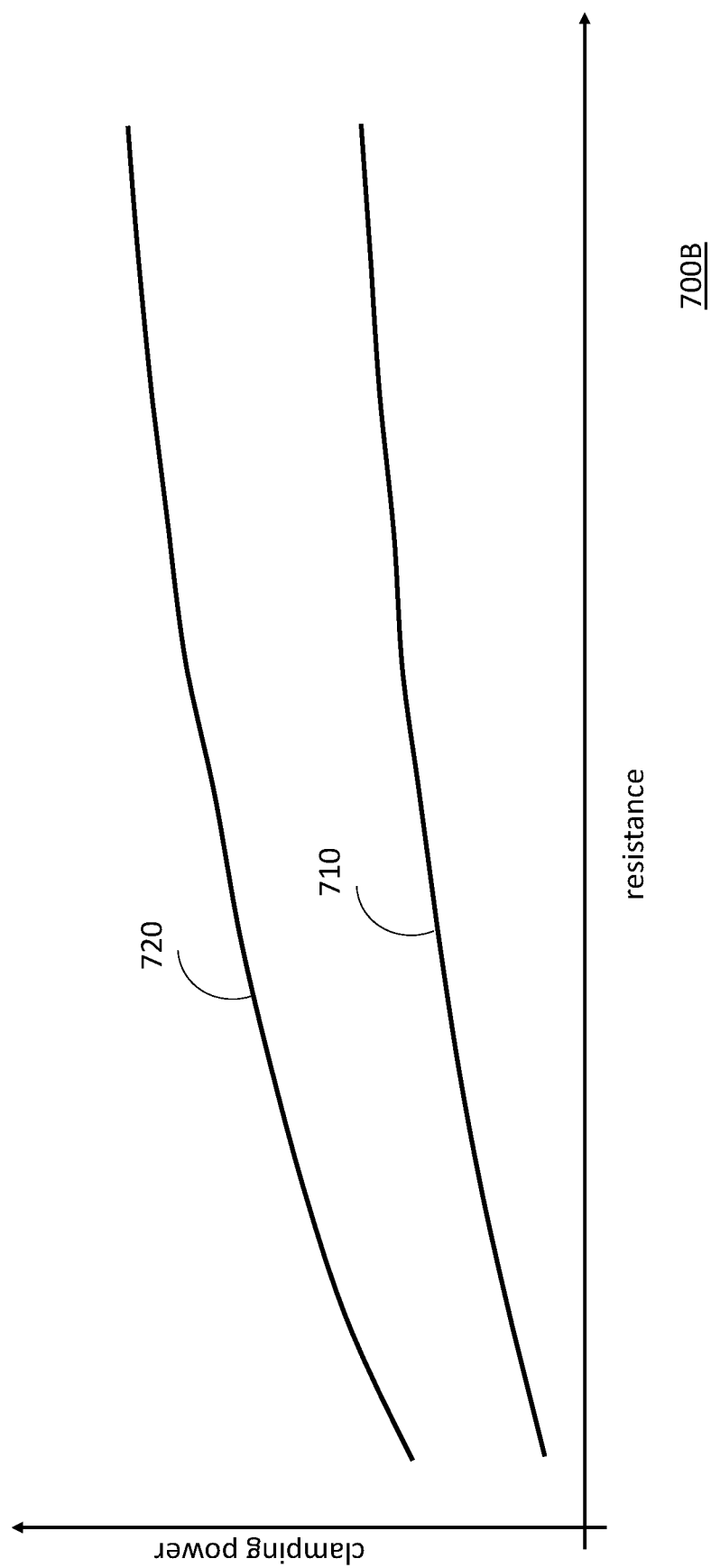
FIG. 7B shows an exemplary graph illustrating the clamping power vs. the resistance values.

This is illustrated by graph (700B) of FIG. 7B where curve (710, 720) represent the clamping output power vs. the resistance values for a first and a second input power, respectively, and where the second input power is greater than the first input power. As can be seen and mentioned above, the clamping output power follows an increasing trend with the increase of the resistance. In an embodiment, variable resistors (R7, R7') are programmable and receive control signals from an external control circuit (not shown).

Referring back to FIG. 7A, the person skilled in the art will understand that the placement of the resistors on one side (top or bottom) or both sides of clamping circuit (C7) will have no consequence on the resulting output clamping power level. The combination of the variable resistors (R7, R7') is essentially equivalent to a resistive ladder which acts as a voltage divider setting the power level at the input of the clamping circuit (C7) thus adjusting the clamping power based on the desired requirements.

Figure 7C:
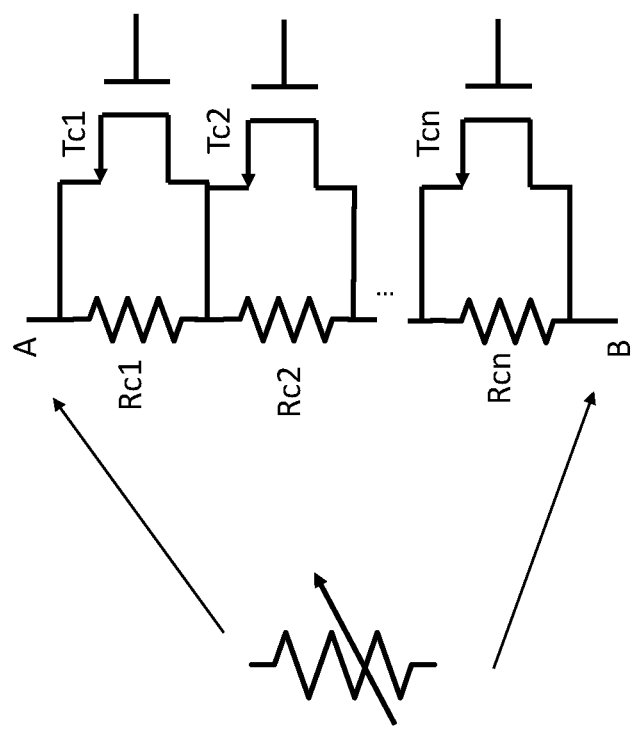
FIGS. 7C-7D show exemplary implementations of programmable variable resistors according to an embodiment of the present disclosure.

FIG. 7C shows a series programmable resistive ladder (700C) representing an exemplary implementation of any of the resistors (R7, R7') of FIG. 7A. Resistive ladder (700C) comprises transistors (Tc1, . . . , Tcn) and resistors (Rc1, . . . , Rcn) coupled across drain-source terminals of corresponding transistors. The resistance between terminals (A, B) can be adjusted to a desired value depending on the states of transistor (Tc1, . . . , Tcn). Such states may be controlled by providing control voltages to the gate terminals of transistors (Tc1, . . . , Tcn) using an external control circuit (not shown).

Figure 7D:
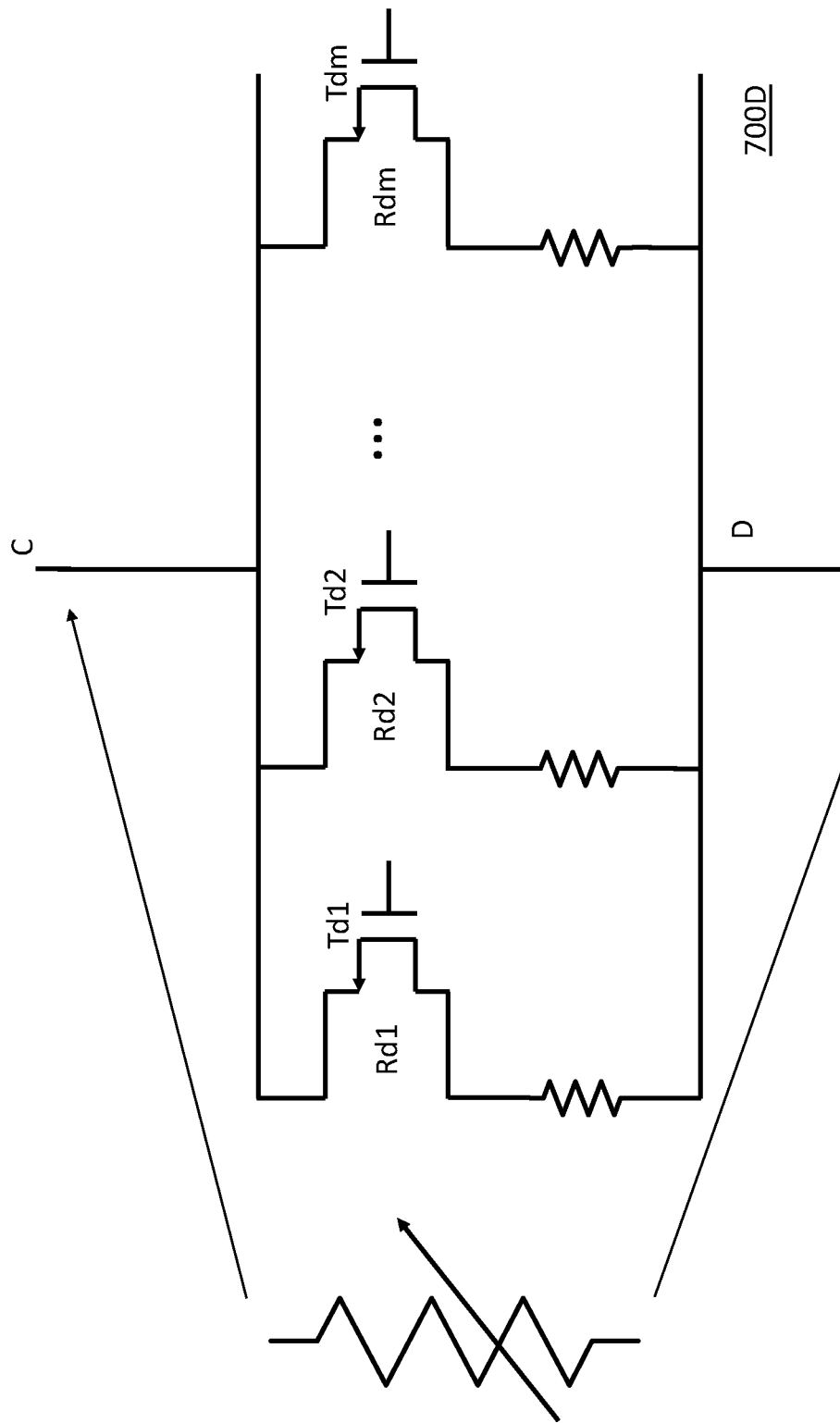

FIG. 7D shows a shunt programmable resistive ladder (700D) representing an exemplary implementation of any of the resistors (R7, R7') of FIG. 7A. Resistive ladder (700D) comprises transistors (Td1, . . . , Tdm) and resistors (Rd1, . . . , Rdm) arranged in series with drain-source terminals of corresponding transistors. The resistance between terminals (C, D) can be adjusted to a desired value depending on the states of transistor (Td1, . . . , Tdm). Such states may be controlled by providing control voltages to the gate terminals of transistors (Td1, . . . , Tdm) using an external control circuit (not shown).

With reference to FIGS. 7A, and 7C, resistors (R7, R7') may be poly resistors or metal based. Such resistors may be sized based on RF power drops across such resistors. In some embodiments, bigger switches (Tcn) may be used as the ON resistance (Ron) of switches may be required to be smaller than the resistance of the resistors (R7, R7').

With reference to clamping blocks of FIGS. 3A, 5A, 6A, and 7A embodiments may be envisaged where a combination of such clamping blocks is implemented. As an example, FIG. 8 shows a clamping block (800) representing essentially a combination of the embodiments of FIGS. 3A and 7A. In other words, clamping block (800) is similar to clamping block (700A) of FIG. 7A except that also the clamping circuit (C8) of FIG. 8, similar to clamping circuit (C3) of FIG. 3A, is configured to receive control signal (Vcnt) that is used to adjust the clamping power of clamping circuit (C8), thus establishing an embodiment with dual control. All the previously disclosed teachings presented with regards to embodiments of FIGS. 3B and 4 equally apply to the embodiment of FIG. 8. As a further example, any of clamping circuit (C3) or a combination of variable resistors (R7, R7') and clamping circuit (C7) of FIG. 7A can replace any clamping circuit shown in embodiments of FIG. 5A or 6A. It is appreciated that such combination provides substantial flexibility towards the design of clamping blocks implemented for various different applications and requirements.

In preferred embodiments, the disclosed clamping circuits are implemented in RF front-end receivers or the LNAs. However, the person skilled in the art will understand that the usage of the disclosed methods and devices is not limited to RF receiver front-ends or the LNAs, and such methods and devices can also be applied to or implemented at any point(s) in the RF circuits where programmable clamping is needed.

the disclosed clamping circuits may be implemented in RF front-end receivers including LNAs, wherein the LNAs may include attenuators in the input path, and the LNA may operate in both active (high gain) and passive (bypass) gain modes. In such RF front-end receivers, the disclosed clamping circuits may be disposed in different locations such as:
the primary input path of the LNAs (i.e., the high gain path),
the attenuator input path,
the bypass path,
the output of the LNA,
the output of an integrated circuit including the LNAs, or
any combination of the above.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. Technologies such as GaAs PIN may be used to implement PIN diode, limiter, Schottky and varactor diodes. However, embodiments of the invention are particularly useful when fabricated using an SOI or SOS based process, or when fabricated with processes having similar characteristics.

Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio-frequency (RF) circuit configured to feed an RF signal with an input power level from an input to an output through a terminal, the RF circuit comprising
a clamping circuit switchably connectable to the terminal, the clamping circuit being configured, in a switched-in state, to clamp the input power level of the RF signal at the terminal to an output power level lower than the input power level, the clamping circuit comprising one or more control inputs to receive control signals to adjust clamping power of the clamping circuit and select the output power level;
wherein the clamping circuit comprises a first diode-connected field effect transistor (FET) and a second diode-connected FET arranged in an antiparallel configuration, and
wherein the one or more control inputs comprise a first control input connected to a body terminal of the first diode-connected FET and a second control input connected to a body terminal of the second diode-connected FET.

2. The RF circuit of claim 1, further comprising a resistive arrangement coupled in series to the clamping circuit, the resistive arrangement comprising one or more variable resistors, the resistive arrangement and the clamping circuit being switchably connectable to the terminal.

3. The RF circuit of claim 2, wherein, in the switched-in state, the output power level at the terminal of the RF circuit is an increasing function of a total resistance of the resistive arrangement.

4. The RF circuit of claim 2, wherein at least one of the one or more variable resistors comprises:
a series arrangement of a plurality of transistors; and
a series arrangement of a plurality of drain-source resistors, each drain-source resistor being coupled across a corresponding transistor of the plurality of transistors,
the plurality of transistors being configured to receive control signals to switch corresponding drain-source resistors in and out.

5. The RF circuit of claim 2, wherein at least one of the one or more variable resistors comprises:
a parallel arrangement of a plurality of transistors; and
a plurality of drain-source resistors, each drain-source resistor being arranged in series with a corresponding transistor of the plurality of transistors,
the plurality of transistors being configured to receive control signals to switch corresponding drain-source resistors in and out.

6. The RF circuit of claim 1, further comprising a resistive control circuit with one or more variable resistors, the resistive control circuit having one or more control nodes connectable to a first control input and a second control input of the clamping circuit.

7. The RF circuit of claim 6, wherein the resistive control circuit has a single control node connectable to the first control input and the second control input of the clamping circuit.

8. The RF circuit of claim 1, further comprising a single-pole single-throw (SPST) switch to switchably connect the clamping circuit to the terminal.

9. A low noise amplifier (LNA) comprising the RF circuit of claim 1, the output of the RF circuit being an output of the LNA.

10. An RF front-end comprising the LNA of claim 9.

11. The RF front end of claim 10, wherein the LNA includes input attenuators, and wherein the clamping circuit is disposed in one of a) a primary input path of the LNA, b)

an attenuator input path of the LNA, c) an output of the LNA, d) an output of the receiver front-end, or a combination thereof.

12. A radio-frequency (RF) circuit configured to feed an RF signal with an input power level from an input to an output through a terminal, the RF circuit comprising
　a switch coupled between the terminal and a clamping circuit;
　the clamping circuit being configured to clamp the input power level of the RF signal at the terminal to an output power level lower than the input power level when the switch is in a closed state;
　the clamping circuit comprising one or more control inputs that receive control signals for adjusting a clamping power of the clamping circuit;
　the clamping circuit comprising a first diode-connected field effect transistor (FET) and a second diode-connected FET arranged in an antiparallel configuration, and
　the one or more control inputs comprising a first control input connected to a body terminal of the first diode-connected FET and a second control input connected to a body terminal of the second diode-connected FET.

13. The RF circuit of claim 12, wherein the first diode-connected FET is a diode-connected N-type FET (NFET), and the second diode-connected FET is a diode-connected NFET.

14. The RF circuit of claim 12, further comprising a resistive arrangement coupled in series to the clamping circuit, the resistive arrangement comprising one or more variable resistors.

15. The RF circuit of claim 14, wherein, when the switch is in the closed state, the output power level at the terminal of the RF circuit is an increasing function of a total resistance of the resistive arrangement.

16. The RF circuit of claim 14, wherein at least one of the one or more variable resistors comprises:
　a series arrangement of a plurality of transistors; and
　a series arrangement of a plurality of drain-source resistors, each drain-source resistor being coupled across a corresponding transistor of the plurality of transistors,
the plurality of transistors being configured to receive control signals to switch corresponding drain-source resistors in and out.

17. The RF circuit of claim 14, wherein at least one of the one or more variable resistors comprises:
　a parallel arrangement of a plurality of transistors; and
　a plurality of drain-source resistors, each drain-source resistor being arranged in series with a corresponding transistor of the plurality of transistors,
the plurality of transistors being configured to receive control signals to switch corresponding drain-source resistors in and out.

18. The RF circuit of claim 12, further comprising a resistive control circuit with one or more variable resistors, the resistive control circuit having one or more control nodes connectable to a first control input and a second control input of the clamping circuit.

19. The RF circuit of claim 18, wherein the resistive control circuit has a single control node connectable to the first control input and the second control input of the clamping circuit.

20. A radio-frequency (RF) circuit configured to feed an RF signal with an input power level from an input to an output through a terminal, the RF circuit comprising a plurality of clamping circuits, the plurality of clamping circuits being switchably connectable to the terminal,
　each clamping circuit of the plurality of clamping circuits:
　　being configured, in a switched-in state, to clamp the input power level of the RF signal at the terminal to an output power level lower than the input power level, and
　　comprising one or more control inputs to receive control signals to adjust a clamping power of the clamping circuit and select the output power level,
　wherein:
　　each clamping circuit of the plurality of clamping circuits has a clamping power different from a clamping power of any other clamping circuit of the plurality of clamping circuits, and
　　a first clamping circuit of the plurality of clamping circuits comprises a field effect transistor (FET) with a first threshold voltage, and a second clamping circuit of the plurality of clamping circuits comprises a FET with a second threshold voltage, the first threshold voltage being different from the second threshold voltage.

\* \* \* \* \*